United States Patent [19]

Hori

[11] Patent Number: 5,414,391

[45] Date of Patent: May 9, 1995

[54] FREQUENCY SYNTHESIZER WITH FREQUENCY-DIVISION INDUCED PHASE VARIATION CANCELER

[75] Inventor: Hidetosi Hori, Tokyo, Japan

[73] Assignee: NEC Corporation, Japan

[21] Appl. No.: 251,785

[22] Filed: May 31, 1994

[30] Foreign Application Priority Data

May 28, 1993 [JP] Japan .................................. 5-148241

[51] Int. Cl.$^6$ ...................... H03L 7/08; H03L 7/193; H03L 7/197
[52] U.S. Cl. ..................................... 331/16; 331/17; 455/260
[58] Field of Search ........................ 331/16, 17, 18, 25; 375/120; 455/260

[56] References Cited

U.S. PATENT DOCUMENTS 5,045,813 9/1991 Yamashita et al. .................... 331/16

Primary Examiner—David Mis
Attorney, Agent, or Firm—Laff, Whitesel, Conte & Saret

[57] ABSTRACT

In a frequency synthesizer, the frequency of clock pulses from a voltage controlled oscillator is divided successively with a first scaling factor during a first period of each repetition interval and with a second scaling factor during a second period of the repetition interval to provide output clock pulses at a reduced frequency, the first and second periods being determined in response to a frequency control parameter. A phase comparator detects a phase difference between the output clock pulses and reference frequency pulses and produces pulses with a duration corresponding to the detected phase difference. A canceling circuit produces a canceling pulse with a duration variable as a function of a count value of the output clock pulses and as a function of the frequency control parameter. The canceling pulse is combined with the output pulses of the phase comparator at the input of a loop filter which is connected to the voltage controlled oscillator.

10 Claims, 4 Drawing Sheets

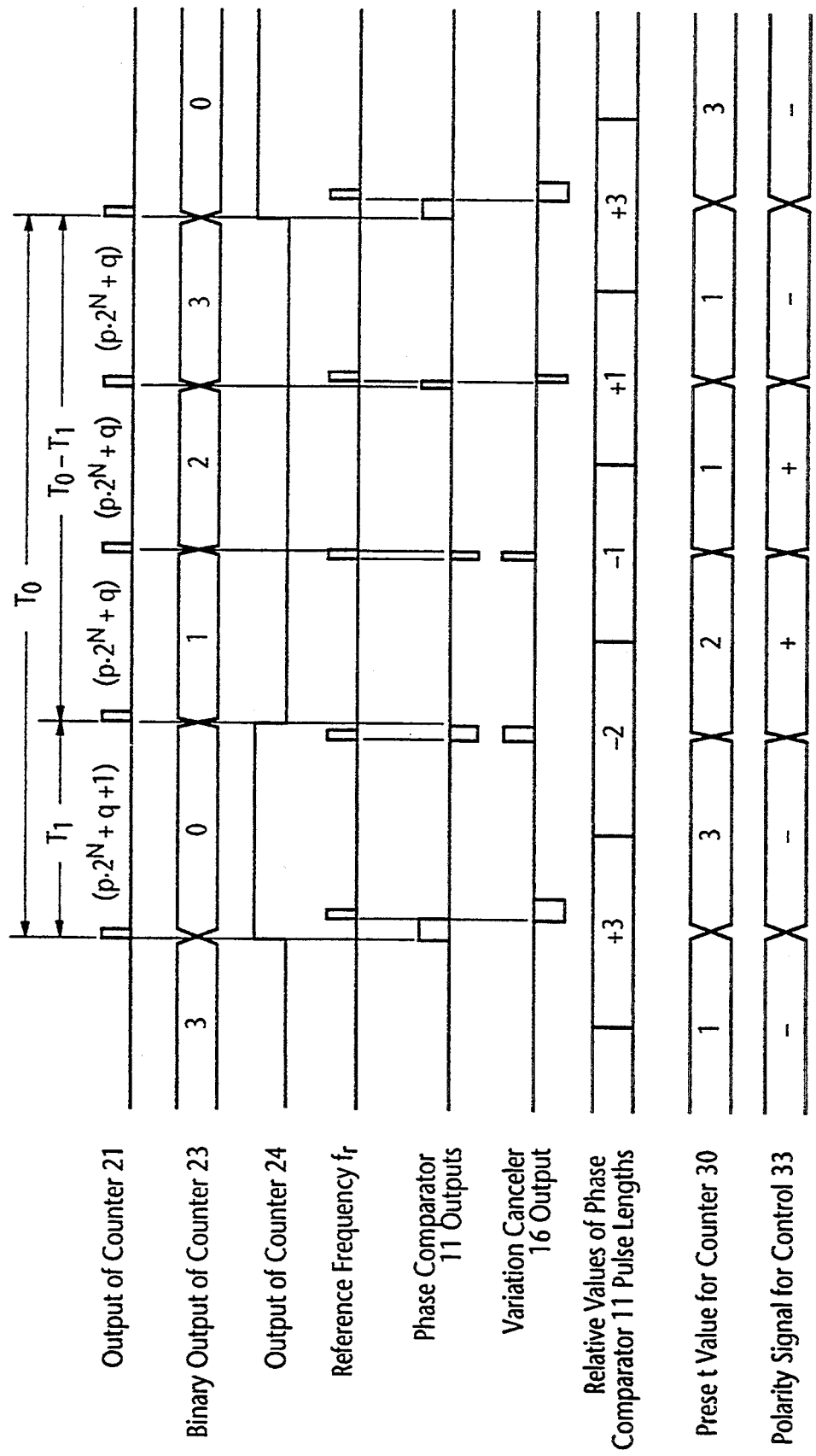

FREQUENCY SYNTHESIZER WITH FREQUENCY-DIVISION INDUCED PHASE VARIATION CANCELER

BACKGROUND OF THE INVENTION

1. Field of the Invention

The present invention relates generally to phase-locked loop frequency synthesizers, and more specifically to such a frequency synthesizer capable of canceling undesired phase differences which occur as a result of dividing clock pulses from a voltage controlled oscillator.

2. Description of the Related Art

The phase-locked loop frequency synthesizer includes a variable frequency divider for dividing the clock frequency of the voltage-controlled oscillator with a variable scaling factor k and a phase comparator for detecting a phase difference between the output of the divider and a reference frequency clock pulse to produce a feedback signal for controlling the clock frequency of the VCO. Since the output frequency $f_o$ of the VCO is the integral multiple (k) of the reference frequency $f_r$, the usual practice is to use a large value for the scaling factor k in order to achieve precision control on the VCO frequency. However, it takes long for the phase-locked loop to attain stability following a change in the scaling factor.

To overcome this problem Japanese Provisional Patent Publication (Tokkaisho) 63-28131 discloses a phase-locked loop frequency synthesizer in which every "s" clock pulses from the VCO are counted to define an interval. During this interval, (k+1) input clock pulses are counted to produce "m" output pulses and "k" input pulses are subsequently counted to produce "s-m" output pulses. A phase difference detected between the "m" and "s-m" output pulses and a reference clock pulses to control the VCO, which produces an output frequency equal to $\{k+(m/s)\}f_r$. Since variation occurs at the output of the phase comparator at intervals corresponding to "s" clock pulses, an analog ramp circuit is provided to generate a ramp pulse. This ramp pulse is supplied to a loop filter where it is combineed with the output of the phase comparator to cancel the undesired phase variation.

However, since the output of the phase comparator is a series of discrete pulses, the use of analog ramp pulses is not satisfactory for precision cancellation of phase variation. This results in the generation of an error in the phase comparator output, causing instability of the VCO output frequency.

SUMMARY OF THE INVENTION

It is therefore an object of the present invention to provide a phase-locked loop frequency synthesizer capable of precision control on the VCO output frequency without producing phase difference errors.

According to a first aspect, the present invention provides a frequency synthesizer comprising a loop filter, a voltage-controlled oscillator connected to the loop filter, and a variable frequency divider for dividing the frequency of input clock pulses from the voltage controlled oscillator according to a frequency control parameter and producing output clock pulses of reduced frequency. The variable frequency divider includes means for dividing the frequency of the input clock pulses with a first scaling factor during a first integral multiple of the interval between successive output clock pulses of the frequency divider and with a second scaling factor during a second integral multiple of the interval, where the first and second integral multiples are a function of the frequency control parameter. A phase comparator detects a phase difference between the output clock pulses of the variable frequency divider and reference frequency pulses and produces output pulses of period corresponding to the detected a phase difference. The output clock pulses of the variable frequency divider are counted during the first and second integral multiples of the interval and a successive count value is produced. A canceling pulse produced with the pulse period being variable as a function of the count value and as a function of the frequency control parameter. The cancelling pulse is combined with the output pulses of the phase comparator at the input of the loop filter to cancel phase variations.

According to a second aspect, the present invention provides a frequency synthesizer which comprises a loop filter, a voltage-controlled oscillator connected to the loop filter, and a variable frequency divider. The variable frequency divider comprises a first counter circuit for dividing the frequency of input clock pulses from the voltage-controlled oscillator with a first scaling factor and a second scaling factor and producing output clock pulses, a second counter circuit for counting the output clock pulses and producing therefrom a successive count value of the output clock pulses, and a third counter circuit connected to the second counter circuit for defining a first and a second integral multiple of the interval between successive ones of the output clock pulses according to the frequency control parameter and producing a first and a second logic signal corresponding respectively to the first and second integral multiples of the interval. A controller is responsive to responsive to the first and second logic signals for causing the first counter circuit to divide the frequency of the input pulses with the first scaling factor during the first integral multiple of the interval and with the second scaling factor during the second integral multiple of the interval. A phase comparator detects a phase difference between the output clock pulses of the first counter circuit and reference frequency pulses and produces output pulses of period corresponding to the detected a phase difference. A canceling circuit produces a pulse of period variable as a function of the count value of the second counter circuit and as a function of the frequency control parameter. A combining circuit is connected between the phase comparator and the loop filter for combining the output pulses of the phase comparator with the canceling pulse.

BRIEF DESCRIPTION OF THE DRAWINGS

The present invention will be described in further detail with reference to the accompanying drawings, in which:

FIG. 4 is a timing diagram illustrating data stored in the translation table of variation canceler.

DETAILED DESCRIPTION

Figure 1:
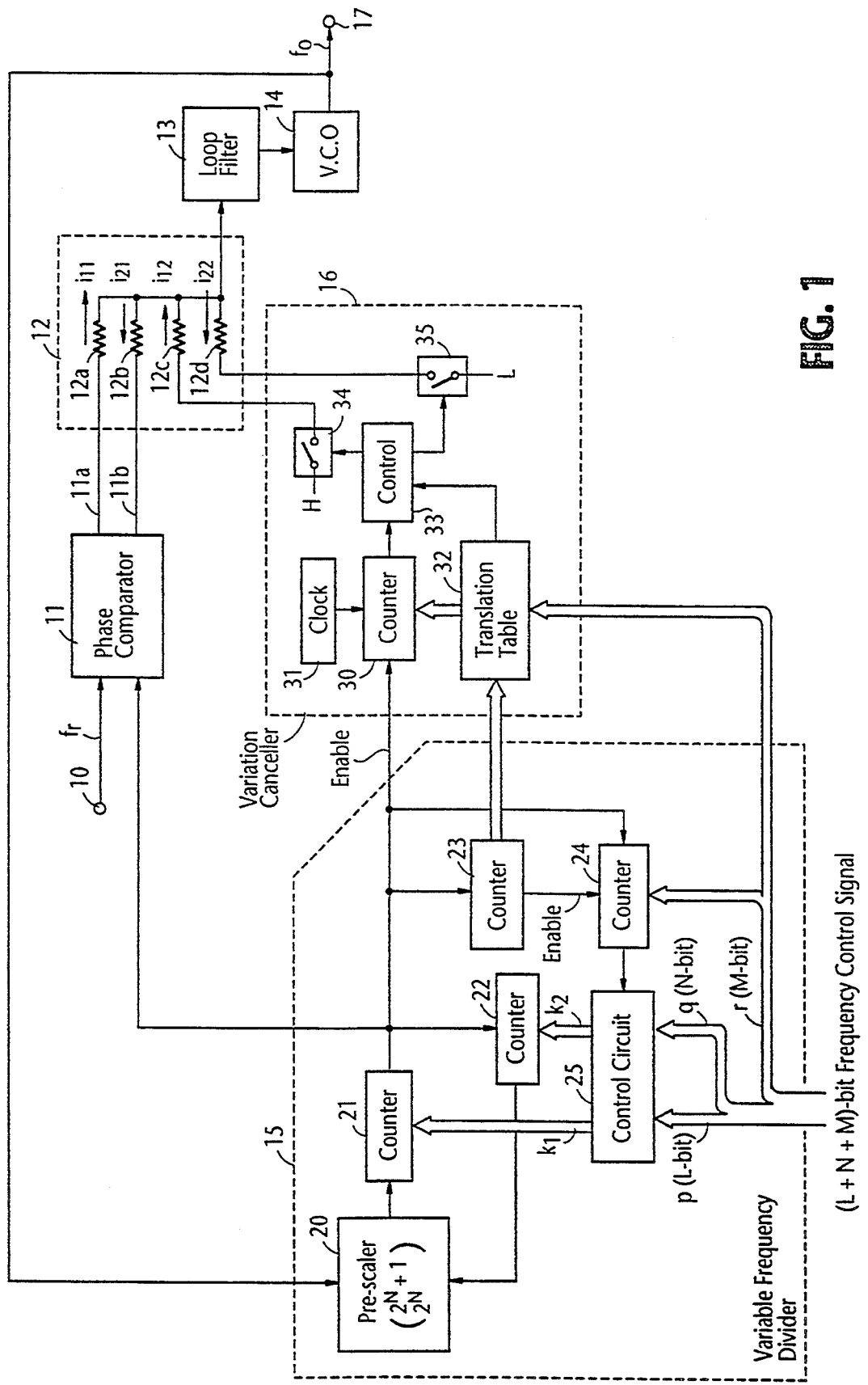
FIG. 1 is a block diagram of a PLL frequency synthesizer according to the present invention.

Referring now to FIG. 1, there is shown a phase-locked loop frequency synthesizer according to the present invention. The frequency synthesizer comprises a phase comparator 11, a resistance adder network 12 formed by resistors 12a, 12b, 12c and 12d, a loop filter 13, a voltage-controlled oscillator 14, and a variable frequency divider 15 connected between the VCO 14 and phase comparator 11 and is adapted to receive a frequency control signal for dividing the output frequency of the VCO. A reference frequency pulse signal $f_r$ is applied through an input terminal 10 to the phase comparator 11 where it is used as a frequency reference for comparison with an output pulse of the frequency divider 15. Phase comparator 11 produces constant-amplitude pulses of variable duration at the output terminal 11a when the divider output leads the reference pulses or at the output terminal 11b when it lags behind them, the duration of these pulses being a function of the phase difference between the two input pulses. The output terminals 11a and 11b of the phase comparator 11 are coupled together by the resistors 12a and 12b at the input of loop filter 13, where the phase comparator output is filtered in known manner, producing a control voltage at the input of the VCO 14. The output frequency signal $f_o$ of VCO 14 appears at an output terminal 17 as well as at the input of the variable frequency divider 15.

As shown in FIG. 1, the frequency divider 15 includes a pre-scaler 20 having two discrete pre-scaling factors $2^N$ and $2^{N+1}$. Pre-scaler 20 divides the output frequency of VCO 14 with a pre-scaling factor $2^{N+1}$ in response to a first binary state of a counter 22 and with a pre-scaling factor $2^N$ in response to a second binary state of the counter 22. The output of pre-scaler 20 is applied to an L-bit programmable, scaling counter 21 which operates as a second scaler for dividing the pre-scaled VCO frequency by an L-bit scaling signal $k_1$ supplied from a control circuit 25. The output of counter 21 is applied to the phase comparator 11 and counter 22. The counter 22 is a programmable counter which operates as a third scaler for dividing the output frequency of counter 21 by an N-bit scaling factor $k_2$ supplied from the control circuit 25. The output of scaling counter 21 is further coupled to an M-bit preset counter 23 which supplies a carry output as an enabling signal at M-bit intervals to a counter 24 to which the output of counter 21 and a parameter "r" which forms part of an (L+M+N)-bit frequency control signal. In response to the enabling signal from counter 23, counter 24 starts counting output pulses of counter 21 and changes its output to high level. The output of counter 24 switches to low level when the count value is equal to "r".

The frequency control signal is comprises an L-bit scaling parameter "p", an N-bit scaling parameter "q", and an M-bit scaling parameter "r", and the L, N and M are the higher, intermediate and lower bits of the frequency control signal, respectively (where $p < 2^L - 1$, $0 \leq q < 2^N$, and $r < 2^M$). The L-bit scaling parameter "p" and the N-bit scaling parameter "q" are supplied to the control circuit 25 and the M-bit parameter "r" is supplied to a programmable counter 24.

Figure 2:
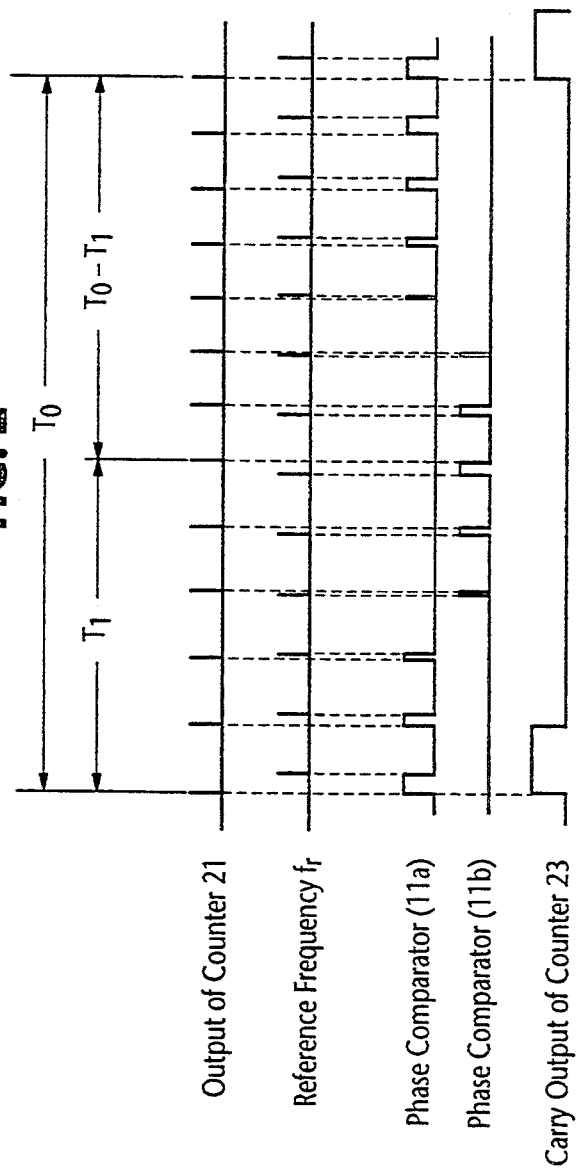
FIG. 2 is a timing diagram illustrating phase variations resulting from the use of a variable frequency divider.

Counter 23 defines a repetition interval $T_0$ corresponding to a count of $2^M$ input pulses from counter 21 (see FIG. 2). The output of counter 24 is high during a period $T_1$ which corresponds to a count of "r" pulses from counter 21 and low during a period $T_0 - T_1$ which corresponds to a count of $(2^M - r)$ pulses from counter 21.

During the period $T_1$, the control circuit 25 sets the respective scaling factors $k_1$ and $k_2$ of counters 21 and 22 so that the overall scaling factor k of the variable frequency divider 15 is set equal to $(p \times 2^N + q + 1)$ and changes it $(p \times 2^N + q)$ during the period $T_2$. Specifically, this is achieved by setting the higher L bits of the scaling value k to the scaling factor $k_1$ and the lower N bits of the scaling factor k to the scaling factor $k_2$.

With the scaling factors $k_1$ and $k_2$ being set to the counters 21 and 22, the counter 22 first sets the pre-scaler 20 to $(2^N + 1)$ for $k_2$ pulses of every $k_1$ output pulses of counter 21 and then to $2^N$ for $(k_1 - k_2)$ pulses of the $k_1$ output pulses (where $0 \leq k_2 < 2^N$). Therefore, the number of VCO clock pulses supplied to the pre-scaler 20 during the interval between successive output pulses of counter 21, and hence, the scaling factor k of the variable frequency divider 15 is given by:

$$k = (2^N + 1)k_2 + 2^N(k_1 - k_2) \quad (1)$$
$$= k_1 \times 2^N + k_2$$

Since the counter 24 is at high level during an integral multiple ($=r$) of the output pulse interval of counter 21 and then to low level during an integral multiple ($=2^M - r$) of the same output pulse interval, the control circuit 25 sets the scaling factor k of variable frequency divider 15 to $(p \times 2^N + q + 1)$ for initial "r" pulses of every $2^M$ output pulses of counter 23 and then to $(p \times 2^N + q)$ for subsequent $(2^M - r)$ pulses of the $2^M$ output pulses. Therefore, the scaling factor k is rewritten as:

$$k = (p \times 2^N + q + 1)r + (p \times 2^N + q)(2^M - r) \quad (2)$$
$$= p \times 2^{(N+M)} + q \times 2^M + r$$

Since $2^M$ pulses are supplied from counter 21 to phase comparator 11 during the repetition interval $T_0$, the VCO 14 produces an output frequency $f_o$ as follows:

$$f_o = (p \times 2^N + q + r/2^M)f_r \quad (3)$$

As shown in FIG. 2, the phase comparator 11 produces pulses on its output lead 11a to lower the VCO frequency if the output of counter 21 leads the reference frequency $f_r$ and produces pulses on its output lead 11b if it lags behind the reference frequency to raise the VCO frequency. It is seen that the outputs of the phase comparator vary at intervals corresponding to the outputs of counter 23. Since the rate of this phase variation is very low, it is impossible to eliminate it by the loop filter 13 whose cut-off frequency is determined by the time constant of the phase locked loop as well as by the output rate of the scaling counter 21.

According to the present invention, a variation canceller 16 is provided which comprises a $2^{M+1}$-bit programmable counter 30 clocked at a high-frequency pulses from a clock source 31, a translation table 32, a switching controller 33 which selectively applies an output pulse from counter 30 to switches 34 and 35 according to a polarity signal from translation table 32. Translation table 32 is supplied with the digital count value of counter 23 for translating it into a $2^{M+1}$-bit preset signal as a function of the M-bit scaling control signal "r" and supplying it to the program input of counter 30. Counter 30 is reset in response to the output of counter 21 to start counting pulses from clock source 31 and switches its output to high level at the start of the count operation and switches its output to low level when the count value reaches the value preset by the translation table 32. A high DC voltage source H is connected through the switch 34 to one end of resistor 12c and a low DC voltage source L is connected through the switch 35 to one end of resistor 12d. The other ends of the resistors 12c and 12d are connected together to the input of loop filter 13.

Figure 3:
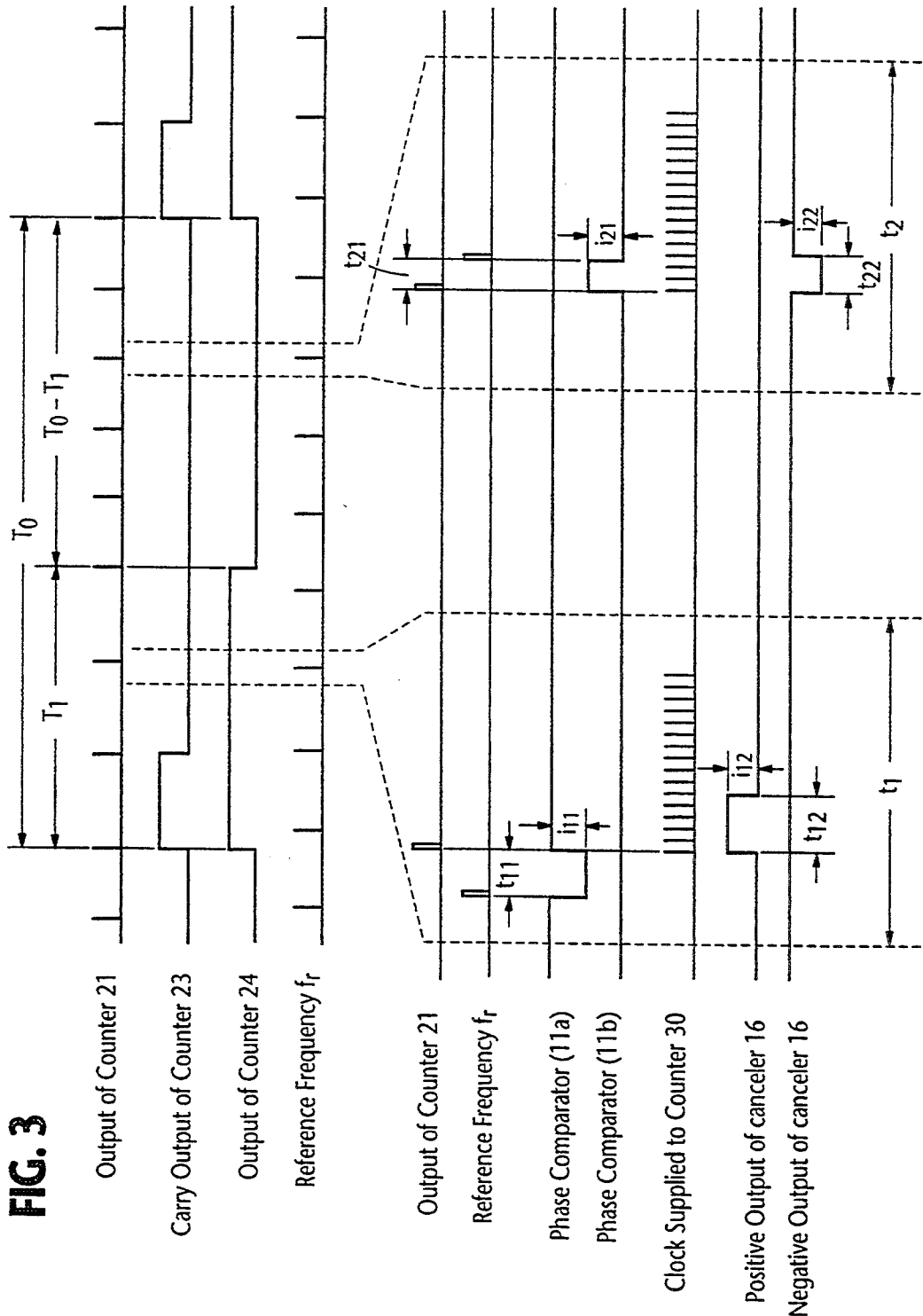
FIG. 3 is a timing diagram illustrating in detail waveforms of phase variation canceler.

If the output of counter 21 lags behind the reference frequency $f_r$ during an interval $t_1$ (see FIG. 3), phase comparator 11 produces a negative pulse current $i_{11}$ with period $t_{11}$ which appears on lead 11a and flows through resistor 12a. If $r=3$ and $M=3$, a series of $2^4$ pulses will be supplied to the $2^{M+1}$-bit counter 30 in response to each output pulse of counter 21. By using the current digital count value of counter 23 and the frequency control parameter "r", translation table 32 presets the counter 30 so that it produces a pulse current $i_{12}$ of period $t_{11}$ which flows through resistors 12c and 12a in a direction opposite to the direction of current $i_{11}$. Since the phase difference $t_{11}$ is one that has been introduced by the variable frequency divider 15, the period $t_{12}$ is determined uniquely as a function of the digital count value of counter 23 and the frequency control parameter "r". The product $i_{12} \times t_{12}$ of the signal at the positive output of canceler 16 can therefore be made equal to the product $i_{11} \times t_{11}$ of the phase comparator output on lead 11a to cancel the phase difference. In like manner, a phase advance during interval $t_2$ will result in a positive current $i_{21}$ with period $t_{21}$ which appears on lead 11b and flows through resistor 12b, and a current pulse $i_{22}$ of period $t_{22}$ is produced by canceler 16 to cancel the current $i_{21}$ by establishing the relation $i_{21} \times t_{21} = i_{22} \times t_{22}$. The phase-difference cancellation of the present invention does not affect on the phase tracking operation of the phase lock loop since it does not cancel the dc component of the phase tracking signal.

One example of implementation of the translation table 32 is shown in FIG. 4 by assuming that $r=1$ and $M=2$, i.e., $T_1/(T_0-T_1)=\frac{1}{4}$. Only one pulse appears at the output of counter 24 for every four output pulses of counter 21 and $(p \times 2^N + q + 1)$ clock pulses from the VCO are counted during period $T_1$ and $(p \times 2^N + q)$ VCO clock pulses are counted three times during of period $T_0 - T_1$. Relative values of the pulse lengths of the output of phase comparator 11 are shown to vary in the range of discrete values between $+3$ and $-3$. Since these relative values can be uniquely determined by the digital count value of counter 23 for $r=1$, the preset value for counter 30 and the polarity signal for switching controller 33 can be set in the translation table 32 as indicated in FIG. 4.

Figure 5:
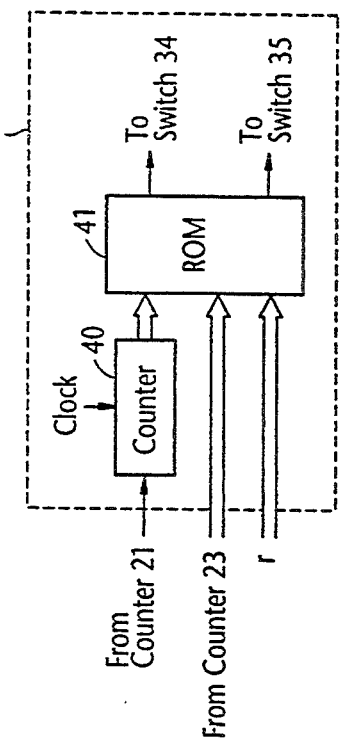
FIG. 5 is a block diagram of an alternative form of the phase variation canceler.

An alternative form of the phase variation canceler 16 is shown in FIG. 5. The alternative form of canceler 16 is implemented with a $2^{M+1}$-bit counter 40 and a read only memory 41. Counter 40 receives the output of counter 21 as an enabling signal to start counting clock pulses and supply a $2^{M+1}$-bit digital count value to the read only memory 41. The digital count value of counter 23 and the M-bit frequency control parameter "r" are also applied to the read only memory 41. Memory 41 stores data representing pulses of various periods for controlling the switches 34 and 35. The data in memory 41 is prepared using the unique relationships between the count value of counter 23 and parameter "r" in relation to the count value of counter 40.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A frequency synthesizer comprising:
    a loop filter;
    a voltage-controlled oscillator connected to the loop filter;
    a variable frequency divider for dividing the frequency of input clock pulses from the voltage controlled oscillator according to a frequency control parameter and producing output clock pulses of reduced frequency, said variable frequency divider comprising means for dividing the frequency of said input clock pulses with a first scaling factor during a first integral multiple of the interval between successive ones of said output clock pulses and with a second scaling factor during a second integral multiple of said interval, said first and second integral multiples being a function of said frequency control parameter;
    a phase comparator for detecting a phase difference between the output clock pulses of the variable frequency divider and reference frequency pulses and producing output pulses of period corresponding to the detected a phase difference;
    counter means for counting the output clock pulses of the variable frequency divider during said first and second integral multiples of the interval of said output clock pulses of the variable frequency divider and producing therefrom a successive count value;
    canceling means for producing a canceling pulse of period variable as a function of said count value and as a function of said frequency control parameter; and
    combiner means connected between the phase comparator and the loop filter for combining the output pulses of the phase comparator with said canceling pulse.

2. A frequency synthesizer as claimed in claim 1, wherein said means for producing cancelling pulses comprises:
    a translation table for translating said count value of said counter means and said frequency control parameter to a counter preset value and a polarity signal;
    a high-frequency clock source;
    programmable counter means preset with said counter preset value for counting clock pulses of the high-frequency clock source until the count of the clock pulse attains the preset value and producing a pulse therefrom; and
    means for generating a current pulse of period in response to the pulse from the programmable counter means and applying said current pulse to said combiner means as said cancelling pulse, said current pulse having first or second polarity depending on said polarity signal.

3. A frequency synthesizer as claimed in claim 1, wherein said means for producing a cancelling pulse comprises:
- a high-frequency clock source;
- second counter means for counting clock pulses of the high-frequency clock source and producing a count value for each of the counted clock pulses;
- memory means for storing data representative of pulse periods addressible as a function of the count value of said second counter means, the count value of the first-mentioned counter means, and said frequency control signal; and
- means for generating a current pulse in response to addressed from the memory means and applying said current pulse to said combining means as said cancelling pulse, said current pulse having first or second polarity depending on said polarity signal.

4. A frequency synthesizer as claimed in claim 2, wherein said combiner means comprises a first pair of resistors having first ends thereof connected to said phase comparator and second, opposite ends thereof connected to said loop filter, and a second pair of resistors having first ends thereof connected to said canceling means and second, opposite ends thereof being connected to said loop filter.

5. A frequency synthesizer as claimed in claim 3, wherein said combiner means comprises a first pair of resistors having first ends thereof connected to said phase comparator and second, opposite ends thereof connected to said loop filter, and a second pair of resistors having first ends thereof connected to said canceling means and second, opposite ends thereof being connected to said loop filter.

6. A frequency synthesizer comprising:
- a loop filter;
- a voltage-controlled oscillator connected to the loop filter;
- a variable frequency divider comprising:
  - first counter means for dividing the frequency of input clock pulses from the voltage-controlled oscillator with a first scaling factor and a second scaling factor and producing output clock pulses;
  - second counter means for counting said output clock pulses and producing therefrom a successive count value of said output clock pulses;
  - third counter means connected to the second counter means for defining a first and a second integral multiple of the interval between successive ones of said output clock pulses according to said frequency control parameter and producing a first and a second logic signal corresponding respectively to said first and second integral multiples of said interval; and
  - means responsive to the first and second logic signals for causing said first counter means to divide the frequency of said input pulses with said first scaling factor during said first integral multiple of said interval and with said second scaling factor during said second integral multiple of said interval;
- a phase comparator for detecting a phase difference between said output clock pulses of the first counter means and reference frequency pulses and producing output pulses of period corresponding to the detected a phase difference;
- canceller means for producing a cancelling pulse of period variable as a function of the count value of said second counter means and as a function of said frequency control parameter; and
- combiner means connected between the phase comparator and the loop filter for combining the output pulses of the phase comparator with said canceling pulse.

7. A frequency synthesizer as claimed in claim 6, wherein said canceler means comprises:
- a translation table for translating said count value of said counter means and said frequency control parameter to a counter preset value and a polarity signal;
- a high-frequency clock source;
- programmable counter means preset with said counter preset value for counting clock pulses of the high-frequency clock source until the count of the clock pulse attains the preset value and producing a pulse therefrom; and
- means for generating a current pulse of period in response to the pulse from the programmable counter means and applying said current pulse to said combiner means as said canceling pulse, said current pulse having first or second polarity depending on said polarity signal.

8. A frequency synthesizer as claimed in claim 6, wherein said canceler means comprises:
- a high-frequency clock source;
- second counter means for counting clock pulses of the high-frequency clock source and producing a count value for each of the counted clock pulses:
- memory means for storing data representative of pulse periods addressible as a function of the count value of said second counter means, the count value of the first-mentioned counter means, and said frequency control signal; and
- means for generating a current pulse in response to addressed from the memory means and applying said current pulse to said combining means as said canceling pulse, said current pulse having first or second polarity depending on said polarity signal.

9. A frequency synthesizer as claimed in claim 7, wherein said combiner means comprises a first pair of resistors having first ends thereof connected to said phase comparator and second, opposite ends thereof connected to said loop filter, and a second pair of resistors having first ends thereof connected to said canceling means and second, opposite ends thereof being connected to said loop filter.

10. A frequency synthesizer as claimed in claim 8, wherein said combiner means comprises a first pair of resistors having first ends thereof connected to said phase comparator and second, opposite ends thereof connected to said loop filter, and a second pair of resistors having first ends thereof connected to said canceling means and second, opposite ends thereof being connected to said loop filter.

* * * * *